(12) United States Patent
Wu

(10) Patent No.: US 8,948,552 B2
(45) Date of Patent: Feb. 3, 2015

(54) LIGHT SOURCE USING LASER DIODES

(71) Applicant: Hon Hai Precision Industry Co., Ltd., New Taipei (TW)

(72) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/901,584

(22) Filed: May 24, 2013

(65) Prior Publication Data

US 2014/0133798 A1    May 15, 2014

(30) Foreign Application Priority Data

Nov. 15, 2012  (TW) ............................ 101142657 A

(51) Int. Cl.
  *G02B 6/12*    (2006.01)
  *G02B 6/43*    (2006.01)
  *H01S 5/40*    (2006.01)
  *G02B 6/125*   (2006.01)

(52) U.S. Cl.
  CPC .............. *G02B 6/43* (2013.01); *H01S 5/4068* (2013.01); *G02B 6/125* (2013.01)
  USPC ........................................... 385/14

(58) Field of Classification Search
  None
  See application file for complete search history.

(56) References Cited

U.S. PATENT DOCUMENTS

| | | | | |
|---|---|---|---|---|
| 5,358,896 A | * | 10/1994 | Komatsu et al. | 438/31 |
| 5,621,837 A | * | 4/1997 | Yamada et al. | 385/88 |
| 6,693,936 B2 | * | 2/2004 | Kitaoka et al. | 372/50.11 |
| 7,019,907 B2 | * | 3/2006 | Verdiell | 359/619 |
| 7,235,150 B2 | * | 6/2007 | Bischel et al. | 156/212 |
| 2001/0024552 A1 | * | 9/2001 | Kitaoka et al. | 385/91 |
| 2002/0110335 A1 | * | 8/2002 | Wagner et al. | 385/89 |
| 2003/0123498 A1 | * | 7/2003 | Ishino | 372/21 |
| 2004/0057653 A1 | * | 3/2004 | Fukuda et al. | 385/14 |
| 2012/0087620 A1 | * | 4/2012 | Pardo et al. | 385/14 |

FOREIGN PATENT DOCUMENTS

| JP | 7-168040 A | * | 7/1995 |
|---|---|---|---|
| JP | 2011-3627 A | * | 1/2011 |

* cited by examiner

*Primary Examiner* — Mike Stahl
(74) *Attorney, Agent, or Firm* — Novak Druce Connolly Bove + Quigg LLP

(57) ABSTRACT

A light source includes a base, a first bonding layer, at least two laser diodes, a second bonding layer, a substrate, and a planar waveguide. The laser diodes are fixed to and are electrically connected to the base using the first bonding layer, and each of the laser diodes includes a side surface for emitting light. The substrate is fixed to the base using the second bonding layer. The waveguide is formed on the substrate and includes an output section including an output end and at least two input branches branching off from an end of the output section opposite to the output end. Each of the input branches includes an input end opposite to the output section and aligning with a respective one of the side surfaces of the at least two laser diodes.

7 Claims, 2 Drawing Sheets

LIGHT SOURCE USING LASER DIODES

BACKGROUND

1. Technical Field

The present disclosure relates to light sources and, particularly, to a light source using laser diodes.

2. Description of Related Art

Laser diodes are widely used as light sources. However, an output of the laser diode may be less than satisfactory, especially when used as the light source of high-power projectors.

Therefore, it is desirable to provide a light source, which can overcome the above-mentioned problems.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Figure 1:
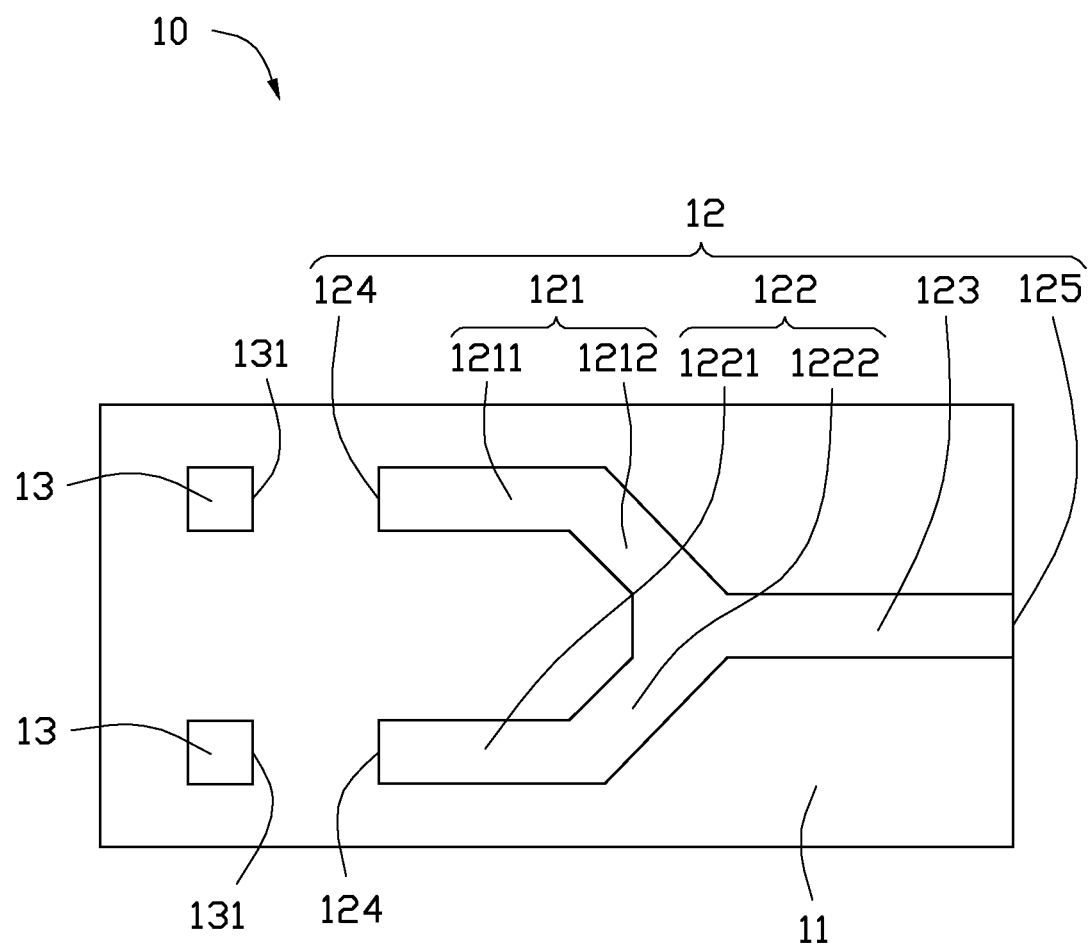
FIG. 1 is a top view of a light source, according to an exemplary embodiment.
Figure 2:
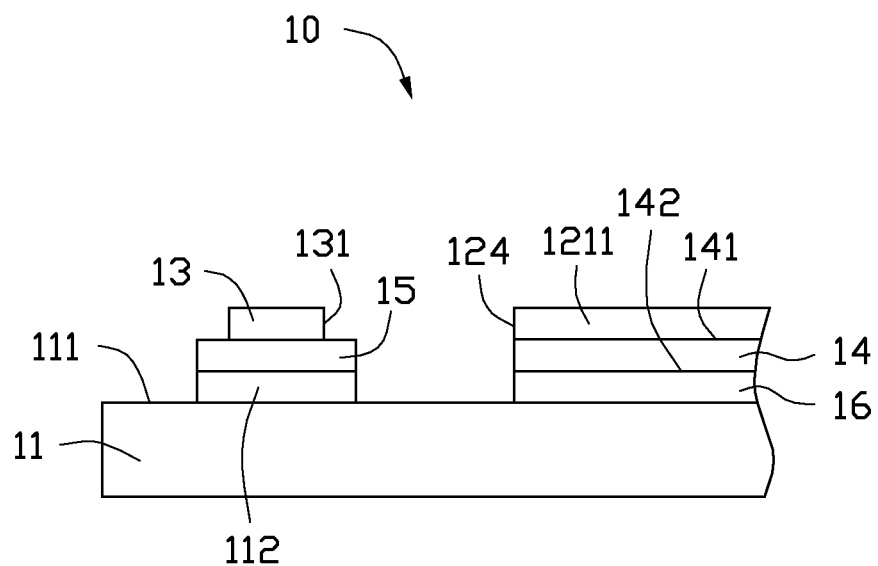
FIG. 2 is a partial side view of the light source of FIG. 1.

FIGS. 1 and 2 show a light source 10 according to an embodiment. The light source 10 includes a base 11, a waveguide 12, two laser diodes 13, a substrate 14, a first bonding layer 15, and a second bonding layer 16.

The base 11 can be a printed circuit board (PCB) and includes a first surface 111 such as a top surface. The base 11 forms two pads 112 on the first surface 111.

The waveguide 12 is a planar waveguide and includes a first input branch 121, a second input branch 122, and an output section 123. Each of the first input branch 121 and the second input branch 122 has an input end 124. The output section 123 has an output end 125. The first input branch 121 includes a first section 1211 having the input end 124 and parallel with the output section 123, and a second input section 1212 extending from an end of the first input section 1211 opposite to the input end 124 to an end of the output section 123 opposite to the output end 125. The second input branch 122 includes a third section 1221 having the input end 124 and parallel with the output section 123, and a fourth input section 1222 extending from an end of the third input section 1221 opposite to the input end 124 to the end of the output section 123 opposite to the output end 125.

The laser diode 13 can be a distributed feedback (DFB) laser diode and includes a side surface 131 from which light emits.

The substrate 14 is for forming and supporting the waveguide 12. For example, the substrate 14 can be made of Lithium Niobate, and the waveguide 12 is formed by diffusing Titanium into the substrate 14. The substrate 14 has an interface 141 contacting the waveguide 12 and a second surface 142 such as a bottom surface opposite to the waveguide 12.

The first bonding layer 15 can be made of conductive adhesive.

The second bonding layer 16 can be made of curable adhesive.

A total thickness of the pad 112 and the first bonding layer 15 is equal to or nearly equal to a total thickness of the second bonding layer 16 and the substrate 14.

In assembly, the first bonding layer 15 is adhered to the pads 112. The laser diodes 13 are aligned with the pads 12 and are pressed onto the first bonding layer 15 by a die bond technology. As such, the laser diodes 13 are fixed to and are electrically connected to the base 11. The second bonding layer 16 is adhered to the first surface 111 and the substrate 14 formed with the waveguide 12 is adhered to the second bonding layer 16 such that the input ends 124 align with the side surfaces 131.

In operation, the laser diodes 13 emit light from the side surfaces 131. The input ends 124 receive the light. The waveguide 12 directs the light from the input ends 124 to the output end 125 and emits the light via the output end 125.

In other embodiments, more than two laser diodes and corresponding input branches can be employed, not limited to two.

As such, an output of the light source 10 can be multiplied and thus be enhanced, as desired.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the possible scope of the disclosure but do not restrict the scope of the disclosure.

What is claimed is:

1. A light source comprising:
    a base;
    a first bonding layer;
    at least two laser diodes fixed to and electrically connected to the base using the first bonding layer, each of the at least two laser diodes comprising a side surface for emitting light;
    a second bonding layer;
    a substrate fixed to the base using the second bonding layer, the substrate comprising an interface and a bottom surface opposite to the interface, the bottom surface directly contacting the second bonding layer;
    a planar waveguide formed on the interface of the substrate and comprising an output section comprising an output end and at least two input branches branching off from an end of the output section opposite the output end, each of the at least two input branches comprising an input end opposite to the output section and aligning with a respective one of the side surfaces of the at least two laser diodes.

2. The light source of claim 1, wherein the base is a printed circuit board and comprises a first surface, the base forms at least two pads on the first surface, the laser diodes are aligned with the pads and electrically connected to the base via the pads, and the base is configured for driving the laser diodes to emit the light from the side surfaces.

3. The light source of claim 2, wherein a total thickness of one of the pads and the first bonding layer is equal to or nearly equal to a total thickness of the second bonding layer and the substrate.

4. The light source of claim 1, wherein the first bonding layer is made of a conductive adhesive.

5. The light source of claim 1, wherein the laser diodes are distributed feedback laser diodes.

6. The light source of claim 1, wherein the second bonding layer is made of curable adhesive.

7. The light source of claim 1, wherein the substrate is made of Lithium Niobate, and the waveguide is formed by diffusing Titanium into the substrate.

\* \* \* \* \*